(12) United States Patent
Kiyomura et al.

(10) Patent No.: US 6,467,158 B1
(45) Date of Patent: Oct. 22, 2002

(54) COMPONENT FEEDER WITH LOAD POSITION ALIGNMENT RECOGNITION

(75) Inventors: Hiroyuki Kiyomura, Osaka; Shinji Kanayama, Nara; Nobuya Matsumura, Kyoto; Kenji Takahashi; Hiroshi Nasu, both of Osaka, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/122,901

(22) Filed: Jul. 27, 1998

(30) Foreign Application Priority Data

Jul. 28, 1997 (JP) .............................. 9-201951

(51) Int. Cl.$^7$ ................................ H05K 3/30
(52) U.S. Cl. ............ 29/740; 29/DIG. 44; 29/720; 29/739; 29/743; 29/832; 29/833; 29/834; 198/395; 901/40; 294/64.1; 414/737; 414/752.1
(58) Field of Search ............... 198/377.08, 395, 198/408, 409; 29/DIG. 44, 707, 714, 720, 721, 740, 739, 741, 743, 832, 833, 834, 836, 837; 901/40; 294/2, 64.1; 414/737, 251.1, 752.1

(56) References Cited

U.S. PATENT DOCUMENTS 3,881,605 A * 5/1975 Grossman .................. 198/395
5,018,936 A * 5/1991 Izumi et al. ................. 198/395
5,086,559 A    2/1992 Akatsuchi
5,251,266 A * 10/1993 Spigarelli et al. ............. 29/740
5,323,528 A *  6/1994 Baker .......................... 29/721
5,588,195 A * 12/1996 Asai et al. .................... 29/740
5,878,484 A *  3/1999 Araya et al. .................. 29/721
6,148,511 A * 11/2000 Taguchi ....................... 29/834

FOREIGN PATENT DOCUMENTS

| GB | 2096498 | 10/1982 | |
|---|---|---|---|
| JP | 161027 | 3/1989 | |
| JP | 401315199 A * | 12/1989 | .................. 29/740 |
| JP | 715181 | 1/1995 | |
| JP | 738300 | 2/1995 | |
| JP | 846394 | 2/1996 | |
| JP | 878893 | 3/1996 | |
| JP | 951197 | 2/1997 | |
| JP | 997805 | 4/1997 | |

* cited by examiner

Primary Examiner—Rick K. Chang
(74) Attorney, Agent, or Firm—Price and Gess

(57) ABSTRACT

A component feeder including a rotary mechanism 31 which is mounted on a turning mechanism 17 for turning the suction nozzle 3 and causes the suction nozzle 3 to rotate around its axis line A, a detector 7 for detecting an amount of displacement the component 2 in rotating direction around the axis line A of the suction nozzle 3, and a controller 32 which controls the suction nozzle 3 such as to rotate at a necessary angle around its axis line A before picking up the component 2 in accordance with displacement of the component 2 in rotating direction around the axis line A.

1 Claim, 5 Drawing Sheets

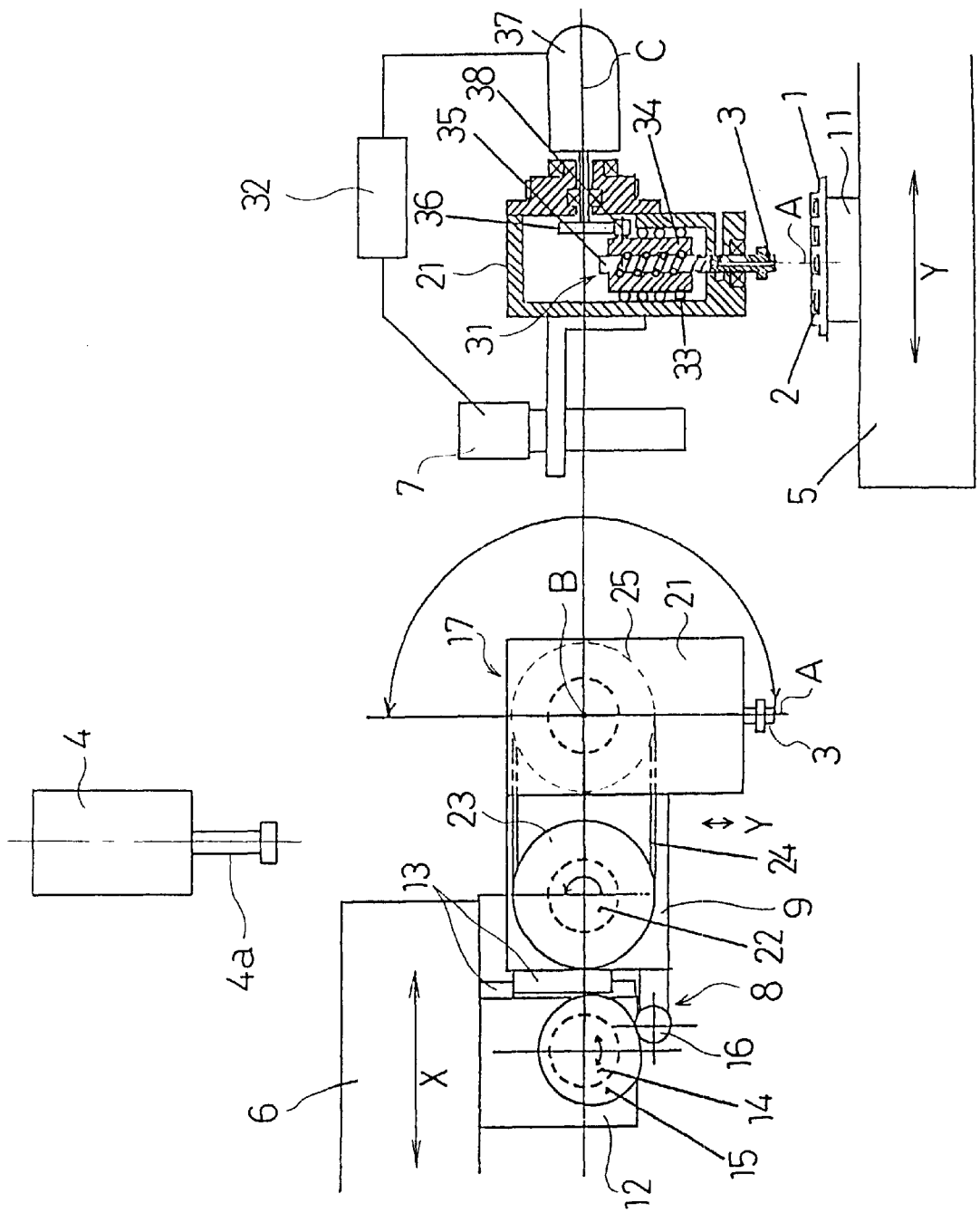

COMPONENT FEEDER WITH LOAD POSITION ALIGNMENT RECOGNITION

BACKGROUND OF THE INVENTION

1. Field of the Invention

The present invention relates to a method and apparatus for feeding a component, and particularly to a component feeder by which an electronic component on a tray or an expanded sheet is picked up by a suction nozzle which is then turned over 180-degree so as to reverse the face of the picked-up component and is fed for mounting, and further to a component mounting method using such method and apparatus for feeding a component for carrying out component mounting operation onto the circuit substrate.

2. Description of the Related Art

In recent years, flip-chip mounting has become a main stream procedure in the field of semiconductor mounting technology as the miniaturization of a circuit substrate has been progressing as represented by a multi-chip module or a chip-size package.

An apparatus for flip-chip mounting is constructed such as shown in FIG. 3, in which an integrated circuit (IC) chip 102 located on a tray 101 with its circuit face upward is picked up by a suction nozzle 103, which is then rotated 180-degrees so as to turn over the IC chip 102 before feeding it to a mounting nozzle 104a of bonding head 104 which mounts the chip onto a circuit substrate 119.

Alternatively, as shown in FIG. 4 which illustrates another conventional component mounting apparatus, a chip 112 on an expanded sheet 111 is picked up by the suction nozzle 103, flipped by turning movement of the suction nozzle 103, and transferred to the mounting nozzle 104a.

The mounting nozzle 104a of the bonding head 104 attracts the IC chip 102 which has been reversed to have its circuit face downward, transfers it to a mounting position and mounts it on a prescribed location on the circuit substrate 119 with the circuit surface of the chip facing down. The IC chip 102 is then mounted on the circuit substrate 119 by connecting terminals on the circuit surface of the chip and a conductive pattern on the circuit substrate 119 by soldering or similar procedure.

The apparatuses shown in FIGS. 3 and 4 are capable of positioning the tray 101 or the expanded sheet 111 at a desired location in a Y direction, and for that purpose it is provided with a moving robot 105 for driving the tray 101 or the expanded sheet 111 in the Y direction. In addition, these apparatuses include another moving robot 106 for causing the suction nozzle 103 to move in an X direction which is orthogonal to the Y direction, so that the nozzle 103 can be positioned at a necessary location in the X direction. With this arrangement, an IC chip 102(112), wherever it is located on the tray 101 or on the expanded sheet 111, can be brought to confront a predetermined suction nozzle 103 and be picked up. The state of the IC chip 102(112) being positioned in relation to the suction nozzle 103 is monitored by a recognition camera 107. The suction nozzle 103 moves upward and downward for the action of picking up the IC chip 102(112), and such movement of the nozzle 103 is effected by a vertical motion mechanism 108 mounted on the moving robot For the purpose of reversing the face of the IC chip 102(112), the suction nozzle 103 is supported by a turning mechanism 117 which is mounted on the vertical motion mechanism 108 and has its turning center line Q which is orthogonal to a plane including an axis line P of the suction nozzle 103, so that a suction nozzle 103 facing down which has picked up an IC chip 102(112) can be turned 180-degrees around the turning center line Q and be faced upward.

In the above-described component mounting apparatus, it is often the case that the IC chip 102 at a prescribed position on the tray 101 as shown in FIG. 5A is displaced as shown in FIG. 5B due to vibration or the like during transfer of the tray 101. In order for compensating such displacement, the position of the IC chip 102 on the tray 101 is recognized by a recognition camera 107 before the suction nozzle 103 picks it up, whereupon a necessary amount of position correction is obtained from positional relationship between the center axis of the camera and the center of the IC chip 102, based on which the position of the suction nozzle 103 is adjusted in X- and Y- directions. The position of the IC chip 102 in relation to the suction nozzle is thus corrected before it is picked up.

However, in case IC chip 102 is displaced at a predetermined angle in a rotating direction, even with the above described position correction in X- and Y- directions, IC chip 102 is not in register with the tip of the suction nozzle 103 as shown in Fig. 5C. Picking up of an IC chip in such condition with the suction nozzle 103 may cause a risk that the suction surface of the nozzle 103 hits the circuit surface of the IC chip 102 rather than bump portions 120, resulting in a flaw or damage on the circuit face of the IC chip 102.

In another component mounting apparatus shown in FIG. 4, a diced wafer 113 is placed on the expanded sheet 111 which is given tension and separated into individual chips 112 by means of expansion of the expanded sheet 111. Here, position correction is necessary since the wafer 113 itself may be displaced in relation to the expanded sheet 111, or each of the chips 112 may be displaced in X- and Y- directions and/or in rotating a direction due to unevenness in the expansion of the expanded sheet 111.

Furthermore, there have been demands that the IC chip 102(112) must be picked up with the suction nozzle more precisely at a predetermined position for the following reason. After the component has been fed from the suction nozzle 103 to the mounting nozzle 104a of the bonding head 104, the circuit surface of the IC chip 102(112) is recognized again on its way to the mounting position so as to inspect the condition of bumps or the position of circuits with another recognizing camera 117. Such recognition is made with a higher number of pixels in this camera in order to accurately recognize electronic circuits which have become more and more complex due to miniaturization of circuit substrates in recent years. There is thus a problem that the IC chip 102 held with the mounting nozzle 104a of the bonding head 104 may not come into the field of view of the recognizing camera if the IC chip 102 is displaced from a predetermined position on the mounting nozzle 104a.

SUMMARY OF THE INVENTION

An object of the present invention is to provide a method and apparatus for feeding a component by which components can be picked up precisely at a predetermined position even when a target component is shifted at a certain angle around the axis line of the suction nozzle.

Another object of the present invention is to provide a method for mounting a component using such method and apparatus for feeding components by which the number of errors in a mounting operation can be reduced.

In order to achieve the above objects, in a component feeder which picks up a component arranged in a row from above with a suction nozzle and turns over the suction nozzle upwards by 180-degree rotation so as to feed the component of which face has been thereby turned over, the present invention is characterized by having: a rotary mechanism mounted on a turning mechanism which causes the suction nozzle to turn, by which the suction nozzle is rotated around an axis line thereof; a detector which detects an amount of displacement of the component in a rotating direction around the axis line of the suction nozzle which is going to pick up the component; and a controller for controlling the rotary mechanism such as to cause the suction nozzle to rotate at a necessary angle around the axis line thereof before picking up the component according to detection results.

The method of feeding a component according to the present invention comprises the steps of: detecting an amount of displacement of the component in a rotating direction around the axis line of a suction nozzle which is going to pick up the component before the suction nozzle picks up the component arranged in a row; rotating the suction nozzle around its axis line at a necessary angle according to detection results so that the component is located at a correct position in relation to the suction nozzle; picking up the component with the suction nozzle; and turning over the suction nozzle upwards by rotation of 180-degrees so as to feed the component of which face has been thereby turned over.

With such an arrangement, since an amount of displacement of the component in a rotating direction which is picked up next is detected by the detector, and the controller controls such that the rotation mechanism causes the suction nozzle to rotate at a necessary angle in accordance with the detection result, the suction nozzle can always pick up the component which is exactly at a predetermined position in terms of its angle around the axis line of the suction nozzle. The suction nozzle is thus prevented from hitting against the circuit face of the component which may cause a chip or a flaw on the component.

It is possible to mount on the turning mechanism a plurality of suction nozzles disposed radially around a turning center line of the turning mechanism. Component pick-up operation can be thereby efficiently carried out by successively using the plurality of suction nozzles. Alternatively, the plurality of suction nozzles may be separately used corresponding to different kinds of components so as to appropriately deal with various types of components.

Moreover, in order to achieve the above objects, the method of mounting components according to present invention comprises the steps of: before picking up the component arranged in a row from above with a suction nozzle, detecting an amount of displacement of the component in a rotating direction around the axis line of the suction nozzle which is going to pick up the component; rotating the suction nozzle around its axis line at a necessary angle according to detection results so that the component comes to locate at a correct position in relation to a predetermined posture of the suction nozzle; picking up the component with the suction nozzle; returning the suction nozzle to its predetermined posture; turning over the suction nozzle upwards by rotation of 180-degree so as to flip the component; transferring the component from the suction nozzle to a mounting nozzle; recognizing conditions of the component held with the mounting nozzle on its way toward a mounting position on a circuit substrate with a recognizing means; correcting the position of the component in accordance with recognition results; and mounting the component on the circuit substrate.

According to the above method, since the displacement of the component in a rotating direction around the axis line of the suction nozzle, which is going to pick up the component, is detected and corrected by rotating the suction nozzle at a necessary angle, it is possible to pick up the component precisely at a predetermined position, by which it is prevented that the component comes out of the field of view of the recognizing camera when the condition of the component is recognized again after it has been fed from the suction nozzle to the mounting nozzle, ensuring that the position of the component to be mounted is certainly recognized. The number of errors in mounting operation can be thereby reduced and production efficiency is increased.

BRIEF DESCRIPTION OF THE DRAWINGS

FIG. 1A is a front view and FIG. 1B is a side view with a partial cross-sectional view of a primary part, both showing an overall construction of a component feeder according to one embodiment of the present invention;

DESCRIPTION OF THE PREFERRED EMBODIMENTS

Preferred embodiments of the present invention will be described below with reference to FIGS. 1A, 1B and FIGS. 2A, The component feeder of preferred embodiments hereinafter described is incorporated in a component mounting apparatus similarly constructed as conventional apparatuses shown in FIGS. 3 and 4. Since actions of the component mounting apparatus are substantially identical to those explained with reference to the prior art, descriptions thereof will be omitted.

(First Embodiment)

Figure 3:
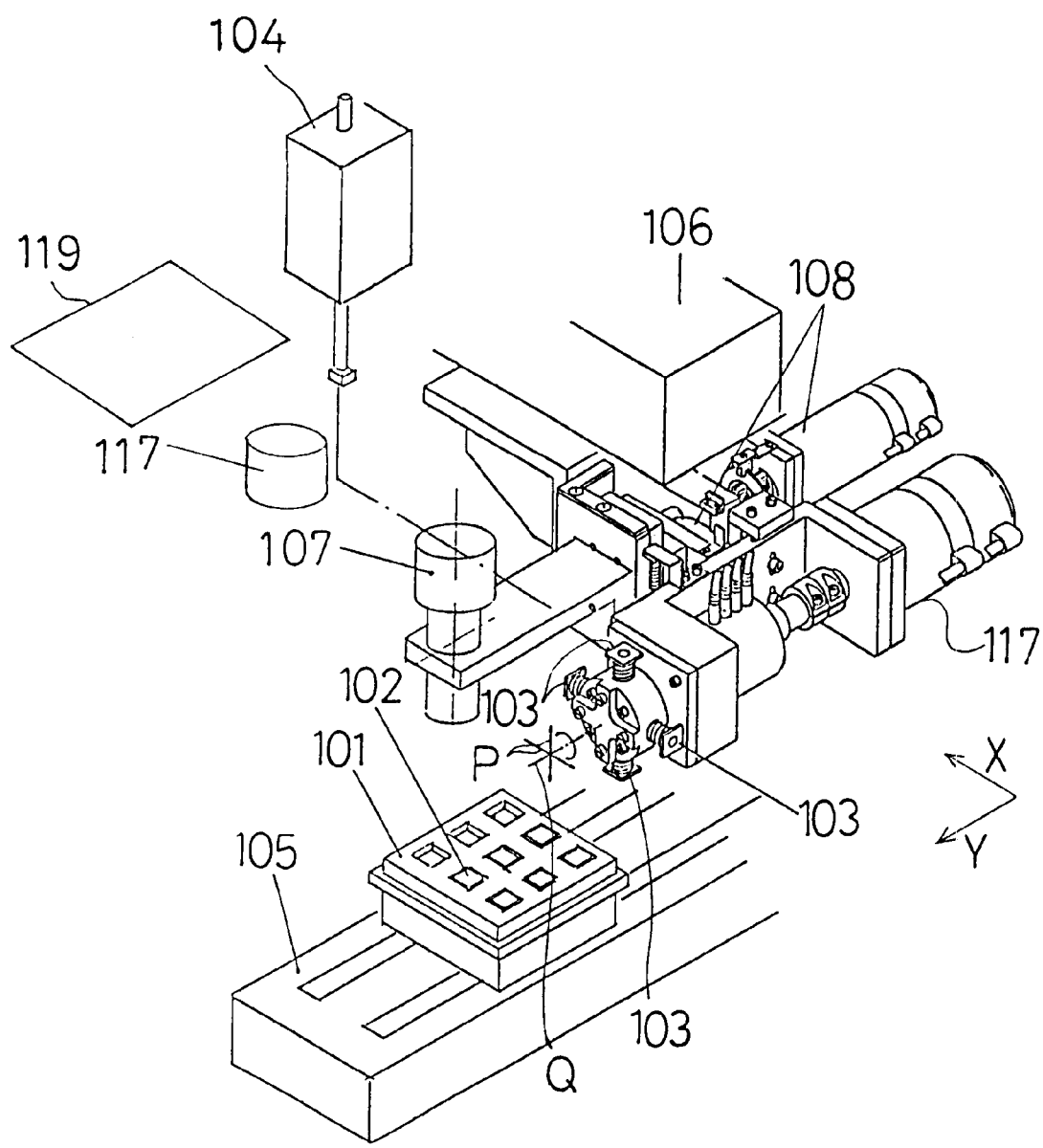
FIG. 3 is a perspective view showing an overall structure of a conventional component mounting apparatus.
Figure 4:
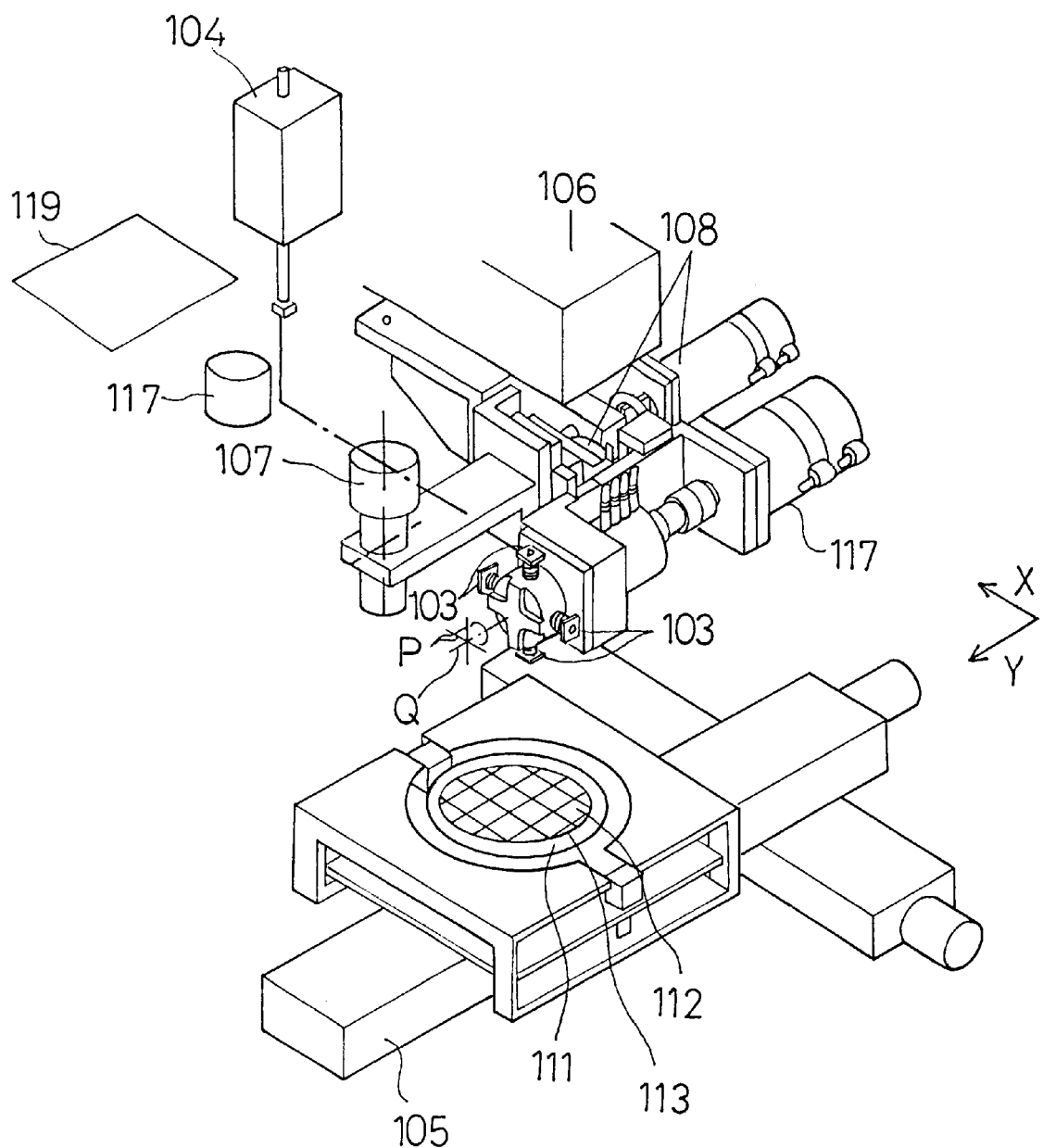
FIG. 4 is a perspective view showing an overall structure of another conventional component mounting apparatus.
Figure 5A:
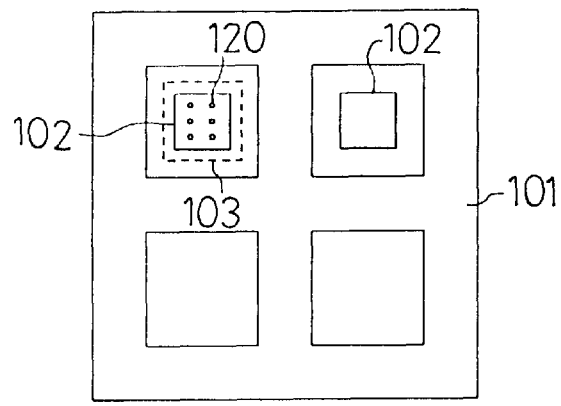
FIGS. 5A–5C are explanatory views showing the position of the component on the tray.
Figure 5B:
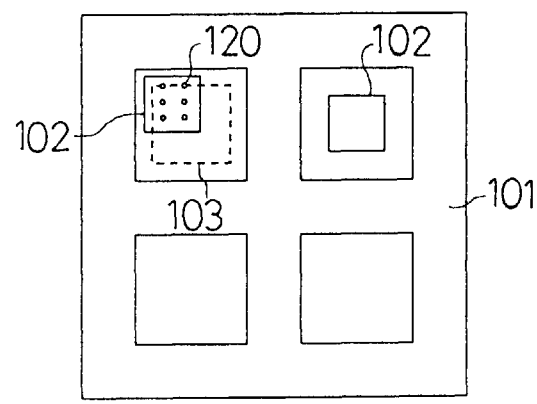
Figure 5C:
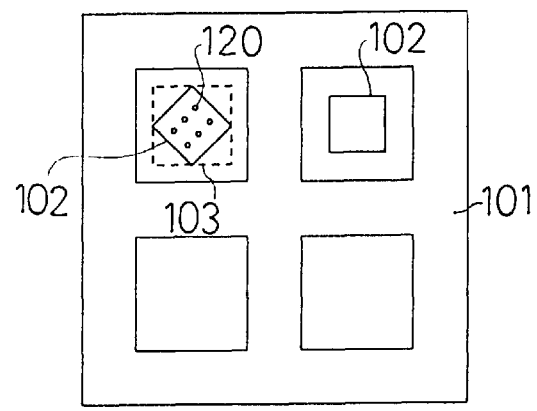

In a first embodiment shown in FIGS. 1A and 1B, similarly with the conventional apparatus of FIGS. 3 and 4, an IC chip 2 located on a tray 1 or an expanded sheet with its circuit face upward is picked up by a suction nozzle 3, which is then rotated 180-degrees so as to turn over the IC chip 2 before it is fed to a mounting nozzle 4a of a bonding head 4 which mounts the chip onto a circuit substrate (not shown).

The schematic construction of the apparatus is, as shown in FIGS. 1A and 1B, such that the tray 1 can be positioned at a desired location in a Y direction with a moving robot 5 for driving the tray 1 in the Y direction, and that the suction nozzle 3 can be positioned at any location in an X direction which is orthogonal to the Y direction with another moving robot 6 for causing the suction nozzle 3 to move in the X direction. Each of the moving robots 5, 6 may be, for example, constructed with a Y-direction moving body 11 and an X-direction moving body 12, respectively, for supporting the tray 1 and the suction nozzle 3 such as to be movable in the Y or the X direction, and a screw shaft which is driven by a servo motor for causing these Y-direction moving body 11 and X-direction moving body 12 to move to a prescribed location in the Y or X direction. With this arrangement, an IC chip 2, wherever it is located on the tray 1, can be brought to confront a predetermined suction nozzle 3 and be picked up. The state of the IC chip 2 being positioned is monitored by a recognition camera 7.

The mechanism for such positioning is not limited to the one described above and any other various means may be also employed.

The picking-up of the IC chip 2 is achieved by vertical motions of the suction nozzle 3 which is effected by a vertical motion mechanism 8 mounted on the X-direction moving body 12 of the moving robot 6. The vertical motion mechanism 8 comprises a vertical motion body 9 supported via a vertical guide 13 on the X-direction moving body 12 for upward and downward movements, a cam 15 driven by a servo-motor 14 mounted on the X-direction moving body 12, and a cam follower 16 provided to the vertical motion body 9 such as to follow the movement of the cam 15. With this arrangement, when the cam 15 is driven to rotate by the servo motor 14, the vertical motion body 9 is moved upward and downward together with the suction nozzle 3 following the movement of the cam 15 via the cam follower 16, so that, when the nozzle 3 is descended above a target IC chip 2, it attracts the chip after which the nozzle is ascended to pick up the IC chip 2 from the tray 1.

For the purpose of flipping the IC chip 2, the suction nozzle 3 is supported by a turning mechanism 17 which is mounted on the vertical motion body 9 and has a turning center line B which is orthogonal to the axis line A of the suction nozzle 3, and is constructed such as to be rotated 180-degrees around the turning center line B, so that the nozzle 3 facing down as shown in FIGS. 1A and 1B and holding the picked-up chip 2 is turned 180-degrees to face upwards. The turning mechanism 17 retains the suction nozzle 3 with its turning body 21 supported on the vertical motion body 9 such as to be rotatable around the turning center line B. Face reversing action of the IC chip 2 is performed such that the rotation of a pulley 23 driven by a servo motor 22 provided to the vertical motion body 9 is transmitted via a belt 24 to another pulley 25 which is coaxially mounted around the turning center line B and integrally mounted on the turning body 21, by which the turning body 21 is rotated every 180-degrees around the turning center line B in one or both directions. In case of employing the servo motor 22 of a one-directional rotary type, since the actuator only needs to pause every 180-degrees rotation, the mechanism may be constructed with an induction motor having a disk provided with a slit every 180 degrees and a sensor for detecting the slit or a rotary actuator.

Specifically in this embodiment, a rotary mechanism 31 for causing the suction nozzle 3 to rotate around its axis line A on the turning body 21 of the turning mechanism 17 for revolving the suction nozzle 3 and a controller 32 consisting of various controlling circuits such as a CPU for controlling the rotary mechanism 31 are provided. The rotary mechanism 31 is controlled such as to cause the suction nozzle 3 to rotate around the axis line A at a necessary angle before picking up an IC chip in accordance with an amount of displacement of the IC chip to be picked up next around the axis line A of the suction nozzle 3, which is detected by a detector for which the recognition camera 7 may be used in common.

The rotary mechanism 31 is constructed with a ball nut 34 of which rotating movement is held in the turning body 21 by a linear guide 33, a ball screw 35 which is coupled with the ball nut 34 and is integrally extended from the suction nozzle 3, a cam 36 mounted to the turning body 21 which rotates around a rotating center line C orthogonal to the axis line A of the suction nozzle 3, a servo motor 37 for driving the cam 36, and a cam follower 38 mounted to the ball nut 34 such as to follow the movement of the cam 36.

In action, the state of an IC chip to be picked up next, i.e., an amount of displacement of the IC chip 2 in rotating direction around the axis line A of the suction nozzle 3 which is going to attract and pick up this chip is detected by image recognition using the camera 7. The detection result is compared with the configuration of the suction nozzle 3 or other factors, and if they do not correspond with each other, the controller 32 causes the cam 36 to rotate at a necessary angle in the rotating direction in accordance with the amount of displacement of the chip by the servo motor 37 before the suction nozzle 3 attracts the IC chip 2.

When the cam 36 is rotated, the ball nut 34 is vertically moved via the cam follower 38 since it is held with the linear guide 33, and causes the ball screw 35 or the suction nozzle 3 to rotate either clockwise or counterclockwise in accordance with the amount of its vertical movement. Accordingly, the orientation of the IC chip 2 in a rotating direction with respect to the suction nozzle 3 which is going to pick it up next is adjusted correspondingly with the suction nozzle 3. Therefore, the suction nozzle 3 picks up IC chip 2 of which angle around the axial line A of the nozzle 3 is always correspondent with that of the suction nozzle 3, whereby it is prevented that the suction surface of the nozzle 3 hits the circuit surface of the component and causes a flaw or chip on the component.

After picking up the component, the suction nozzle is rotated in a reverse direction by the amount corresponding to the one required for position correction, before being turned upwards by 180 degrees.

It should be noted that the vertical motion mechanism, turning mechanism, and rotary mechanism of the suction nozzle 3 described above are only specific examples and various other constructions may be adopted.

(Second Embodiment)

Figure 2A:
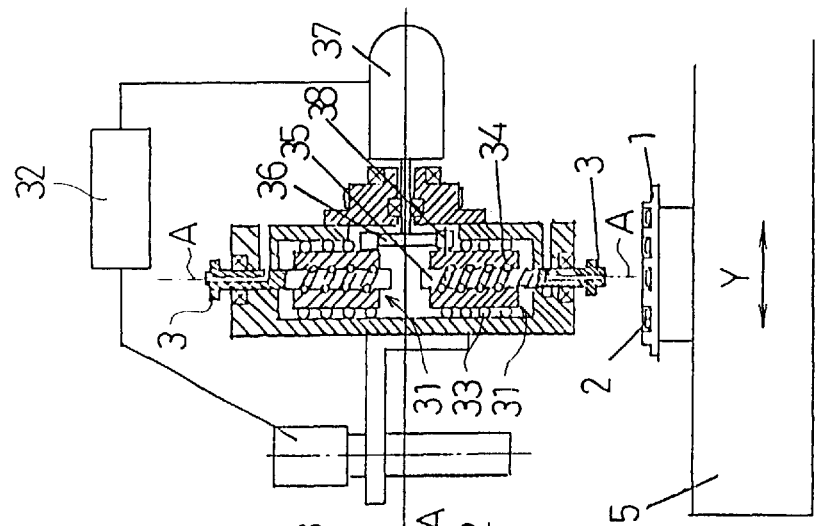
FIG. 2A is a front view and FIG. 2B is a side view with a partial cross-sectional view of a primary part, both showing an overall construction of a component feeder according to another embodiment of the present invention.
Figure 2B:
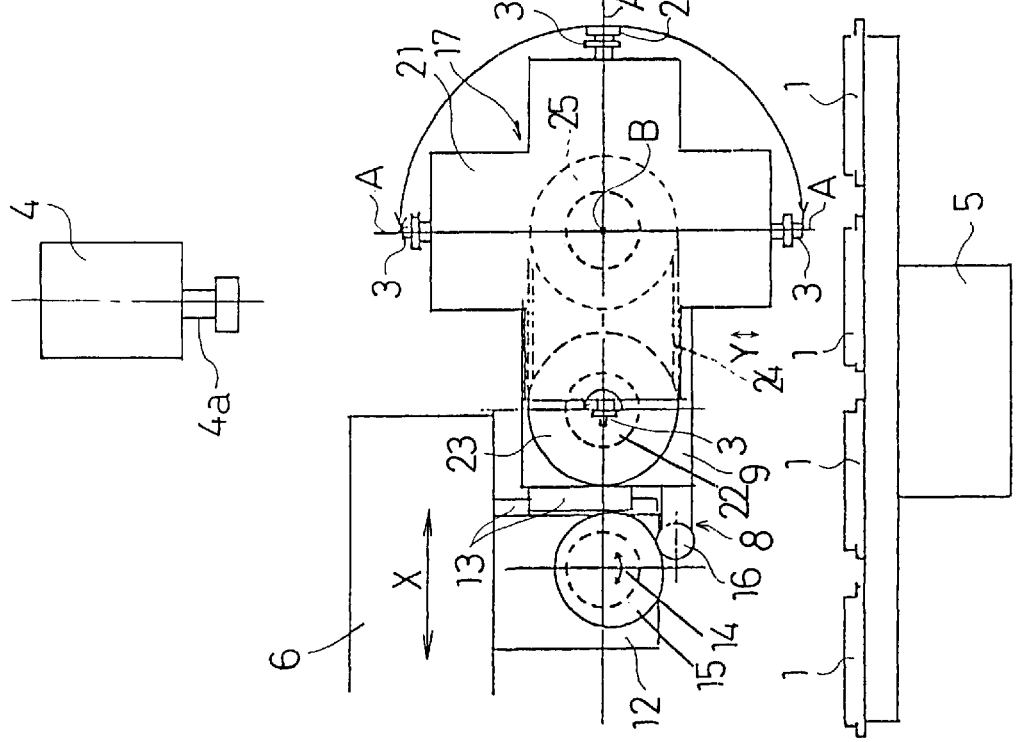

In a second embodiment, as shown in FIGS. 2A and 2B, the turning mechanism 17 is mounted with a plurality of suction nozzles 3 radially disposed around the turning center line B. The picking-up of the IC chip 2 can be achieved with less dead time if the plurality of suction nozzles 3 having the same nozzle diameter are successively used. Alternatively, nozzles 3 of different nozzle diameters may be mounted and separately used corresponding to types of components, so that various kinds of electronic components can be appropriately handled and fed. Other structures and effects are substantially identical to those of the first embodiment. Thus, like elements are given the same reference numerals and the description thereof will be omitted.

More specifically, four suction nozzles 3 having respectively different nozzle diameter are mounted to the turning body 21. Four types of IC chips 2 accommodated respectively on four trays 1 are fed by the moving robot 5, and picked up by corresponding suction nozzles 3. By this arrangement, it is possible to deal with a multiplicity of types of components in addition to the characteristics of the first embodiment.

Although the first and second embodiments have been described in relation to the case of feeding an IC chip 2, the present invention is not limited thereto and may be applied to a feeding operation of various other components which need to be fed with their face reversed for various treatments.

As set forth above, according to the present invention, when feeding components with their face flipped, the component can be picked up by the suction nozzle in a state that the angular position of the component around the axis line of the suction nozzle is in register with that of the suction nozzle, by which it is prevented that the suction nozzle hits against the circuit face of the component thereby chipping or damaging the component.

By mounting a plurality of suction nozzles on the turning mechanism, pick-up operation can be efficiently carried out, or different types of components can be handled and fed.

Furthermore, since the component is picked up with the suction nozzle with their angular positions around the axis line of the suction nozzle in register with each other, it is ensured that the component comes into the field of view of the recognition camera which recognizes the position of the component after it has been fed to the mounting nozzle. With the component held with the mounting nozzle precisely at a desired position, the number of errors in mounting operation can be reduced thereby enhancing efficiency in production.

While a preferred embodiment of the invention has been described using specific terms, such description is for illustrative purposes only, and it is to be understood that changes and variations may be made without departing from the spirit or scope of the following claims.

What is claimed is:

1. In a chip bonding system in which a component feeder picks up quadrangular-shaped IC chips arranged in a row from above with a suction nozzle equipped with a quadrangular-shaped suction surface and turns over the suction nozzle upwards by a 180-degree rotation so as to feed each IC chip of which their chip's face has been thereby turned over, the improvement comprising;

a bonding head for picking and mounting IC chips onto a circuit substrate;

a turning mechanism supported on a movable table comprising a turning body equipped with a suction nozzle at a distal end thereof and turnable around a horizontal axis, whereby the suction nozzle can be faced both upwards and downwards;

a rotary mechanism operably connected to the suction nozzle for causing the suction nozzle to rotate around an axis line thereof;

a detector which detects an amount of displacement of the IC chip in a rotating direction around the axis line of the suction nozzle which is going to pick up the IC chip before the suction nozzle picks up the IC chip; and a controller for controlling the rotary mechanism to cause the suction nozzle to rotate at a necessary angle around the axis line thereof before picking up the IC chip according to said amount of displacement of the IC chip detected by the detector, wherein the rotary mechanism is housed within the turning body of the turning mechanism, and wherein the rotary mechanism includes a ball screw and nut assembly and a drive system for driving the ball screw and nut assembly to rotate the suction nozzle, wherein the drive system includes a motor, a cam member operatively connected to the motor and a cam follower connected to the ball screw and nut assembly whereby movement of the cam member drives the cam follower.

* * * * *